United States Patent [19]

Sentoku et al.

[11] Patent Number: 6,154,281
[45] Date of Patent: *Nov. 28, 2000

[54] POSITION DETECTING SYSTEM AND DEVICE MANUFACTURING METHOD USING THE SAME

[75] Inventors: Koichi Sentoku; Kenji Saitoh, both of Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/883,627

[22] Filed: Jun. 26, 1997

[51] Int. Cl.⁷ ........................................ G01N 11/00
[52] U.S. Cl. ............................ 356/401; 356/399
[58] Field of Search ........................ 356/399–401; 250/559.3, 548; 355/43, 55

[56] References Cited

U.S. PATENT DOCUMENTS

| | | |
|---|---|---|
| 4,037,969 | 7/1977 | Feldman et al. . |
| 4,311,389 | 1/1982 | Fay et al. . |
| 4,856,905 | 8/1989 | Nishi . |
| 4,938,598 | 7/1990 | Akiyama et al. . |
| 5,114,236 | 5/1992 | Matsugu et al. . |
| 5,196,711 | 3/1993 | Matsugu et al. . |
| 5,200,800 | 4/1993 | Suda et al. . |
| 5,285,259 | 2/1994 | Saitoh . |
| 5,313,272 | 5/1994 | Nose et al. . |
| 5,333,050 | 7/1994 | Nose et al. . |
| 5,369,486 | 11/1994 | Matsumoto et al. . |
| 5,377,009 | 12/1994 | Kitaoka et al. . |
| 5,396,335 | 3/1995 | Hasegawa et al. . |
| 5,432,603 | 7/1995 | Sentoku et al. . |
| 5,455,679 | 10/1995 | Houryu et al. . |
| 5,465,148 | 11/1995 | Matsumoto et al. . |
| 5,481,363 | 1/1996 | Matsugu et al. . |
| 5,550,635 | 8/1996 | Saitoh et al. . |
| 5,585,923 | 12/1996 | Nose et al. . |
| 5,610,718 | 3/1997 | Sentoku et al. . |
| 5,625,453 | 4/1997 | Matsumoto et al. . |
| 5,682,239 | 10/1997 | Matsumoto et al. . |

FOREIGN PATENT DOCUMENTS 56-157033  12/1981  Japan .

*Primary Examiner*—Robert H. Kim
*Attorney, Agent, or Firm*—Fitzpatrick, Cella, Harper & Scinto

[57] ABSTRACT

A position detecting system for detecting relative position of a first object and a second object having first and second physical optic elements, respectively, includes a light projecting system for projecting light to one of the first and second physical optic elements, wherein light from the one physical optic element illuminated with the light from the light projecting system is projected to the other of the first and second physical optic elements, and a light receiving system for receiving light from the other physical optic element illuminated with the light from the one physical optic element, wherein relative position of the first and second objects can be detected by detecting positional information related to a position of the thus received light upon a predetermined plane, wherein the light projecting system serves to project lights of different wavelengths on to the one physical optic element in different states of convergence or divergence.

10 Claims, 10 Drawing Sheets

POSITION DETECTING SYSTEM AND DEVICE MANUFACTURING METHOD USING THE SAME

FIELD OF THE INVENTION AND RELATED ART

This invention relates to a position detecting system and a device manufacturing method using the same. The present invention is suitably applicable to a position detecting system for use in a proximity type exposure apparatus or an exposure apparatus called a stepper, for manufacture of semiconductor devices, in relative positioning (alignment) of a first object such as a mask or reticle (hereinafter "mask") and a second object such as a wafer when a fine electronic circuit pattern formed on the surface of the first object is to be transferred and printed on the surface of the second object.

In semiconductor device manufacturing exposure apparatuses, relative alignment of a mask and a wafer is an important factor for enhancement of performance. Particularly, for alignment procedure in recent exposure apparatuses, an alignment precision of submicron order or higher order is required because of higher degree of integration of semiconductor device.

In many alignment systems, alignment patterns (alignment marks) are formed on a mask and a wafer, in portions called scribe lines thereon. On the basis of positional information obtainable from these patterns or marks, the mask and the wafer are brought into alignment with each other.

As regards the alignment method therefor, U.S. Pat. No. 4,037,969 or Japanese Laid-Open Pat. Application, Laid-Open No. 157033/1981 shows use of a zone plate for such an alignment pattern. Light is projected to the zone plate and the position of a focused light spot, of the light from the zone plane, as defined on a predetermined plane is detected.

U.S. Pat. No. 4,311,389 shows use of an alignment pattern on the surface of a mask, which pattern has an optical function similar to that of a cylindrical lens. A dot-array like alignment pattern is formed on the surface of a wafer, to receive diffraction light from the alignment pattern of the mask. The alignment pattern of the wafer is so arranged that the quantity of diffraction light therefrom, of a predetermined order, becomes maximum when the mask and the wafer are in alignment with each other. The relative positional relation between the mask and the wafer is thus detected by detecting the light influenced by both of these alignment patterns.

Among these alignment methods, a method which uses a straight diffraction grating or a zone plate, as an alignment mark, has a feature that it ensures a relatively high alignment precision suitable for semiconductor processing in the sense that it is less affected by any fault in the alignment mark.

Usually, for detection of a relative positional deviation between a mask and a wafer along a plane parallel to the surface of them and for adjustment of alignment between them, light coming from alignment marks (alignment patterns) formed on the mask surface and wafer surface is received by a sensor, and positional information obtainable in response to it is used to perform alignment of them.

There are cases wherein, due to various factors such as the material of a membrane of a mask, process dependency of a wafer, and a difference in film thickness of a resist applied to the wafer surface, the intensity of convergent or divergent light coming from the alignment mark on the wafer varies. In that occasion, it is difficult to obtain a good signal-to-noise ratio (S/N ratio) for satisfactory measurement signal light, and stability of an alignment signal is degraded. Thus, it is difficult to assure high precision position detection.

If the wavelength of irradiation light, for example, is changed in an attempt to solving that problem, there remains a problem that signal light directed to a photodetector diverges because of difference in convergent or divergent state of light from the alignment mark. Thus, high precision position detection is still difficult to attain.

SUMMARY OF THE INVENTION

It is an object of the present invention to provide a position detecting system by which a relative positional deviation between first and second objects can be detected very precisely even when the state of the first and/or second object changes, whereby high precision alignment of them is assured.

It is another object of the present invention to provide a device manufacturing method which uses such a position detecting system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
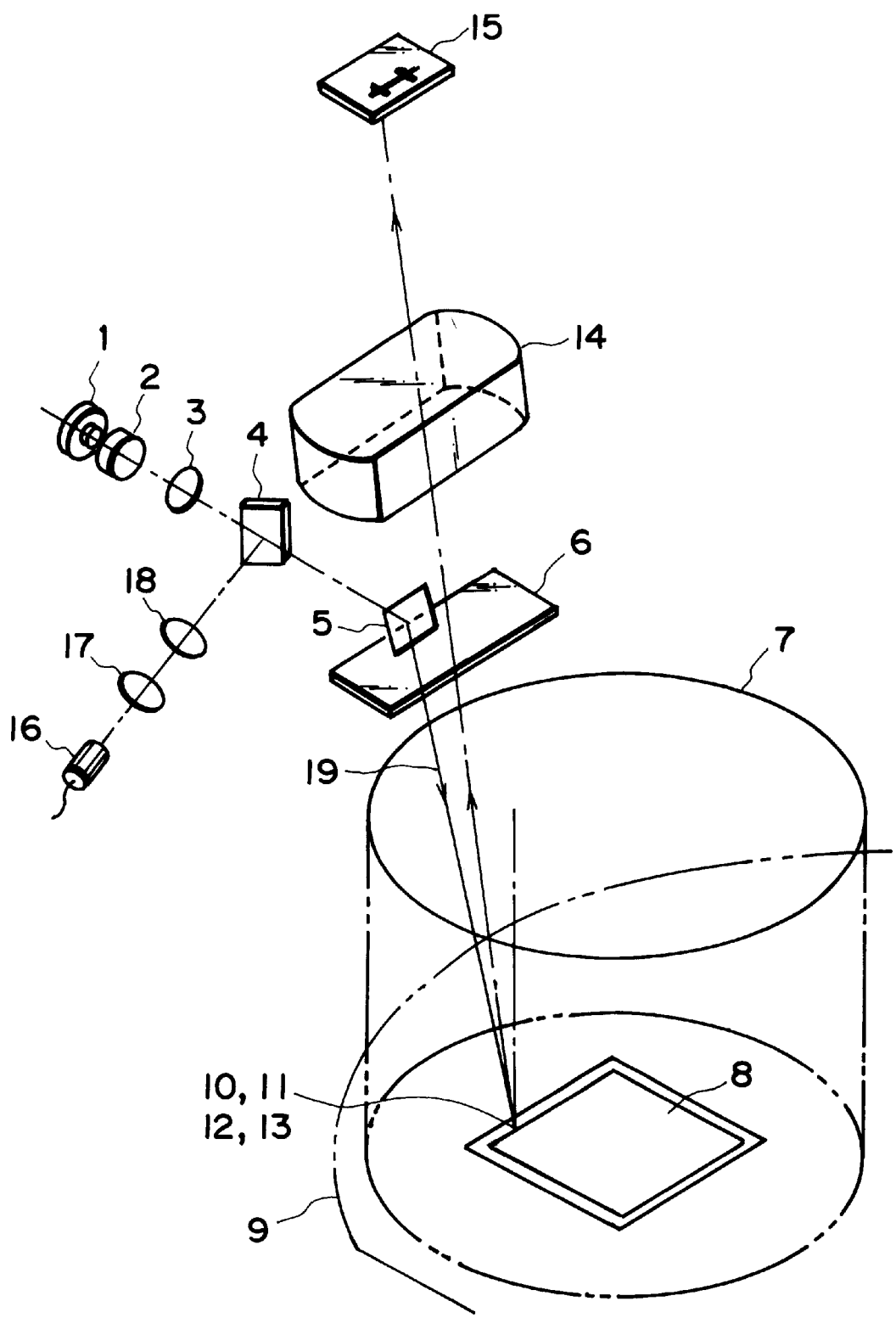
FIG. 1 is a schematic and perspective view of a main portion of a position detecting system according to a first embodiment of the present invention.
Figure 2:
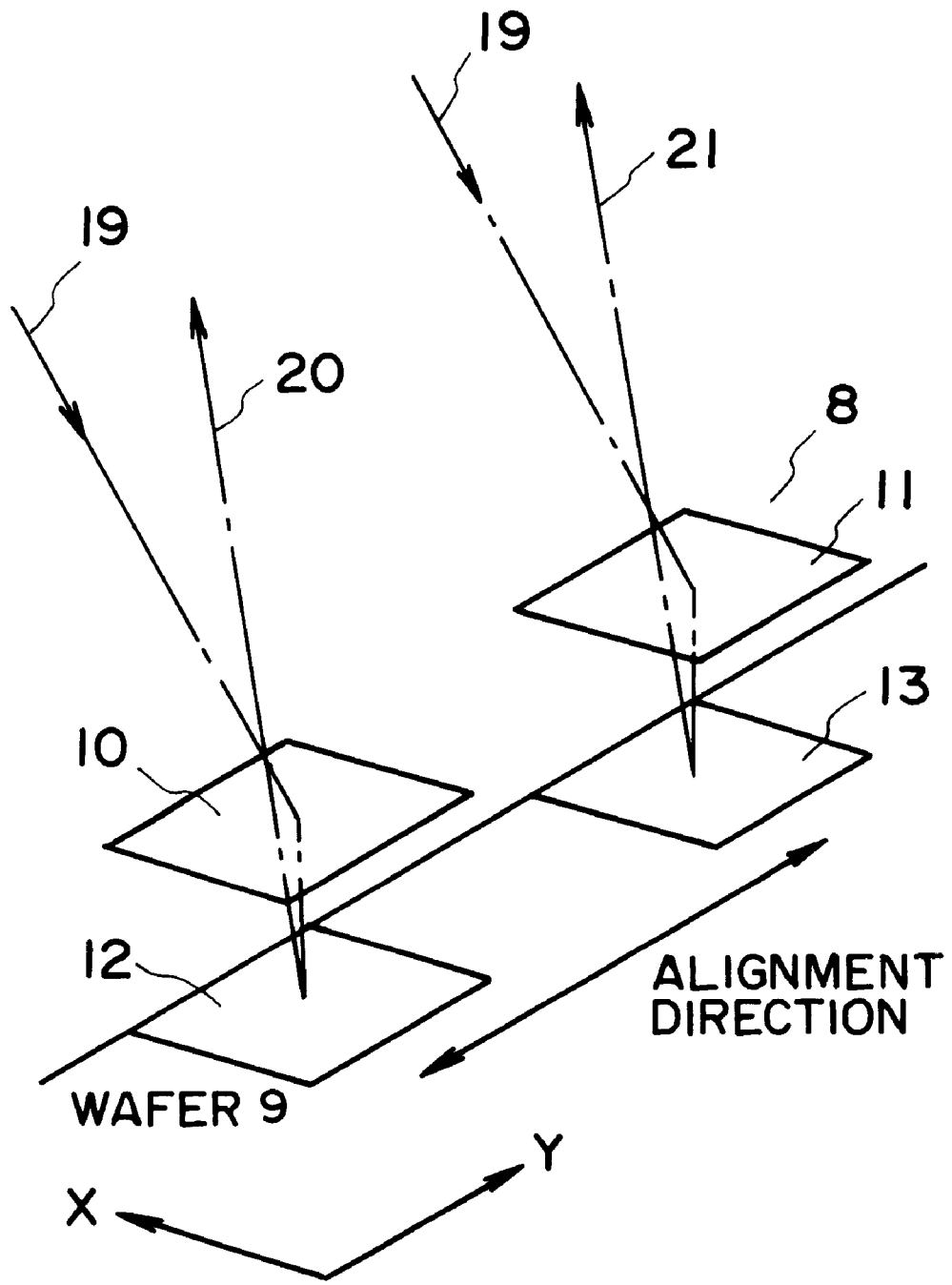
FIG. 2 is a schematic view for explaining alignment marks used in the FIG. 1 embodiment.
Figure 3:
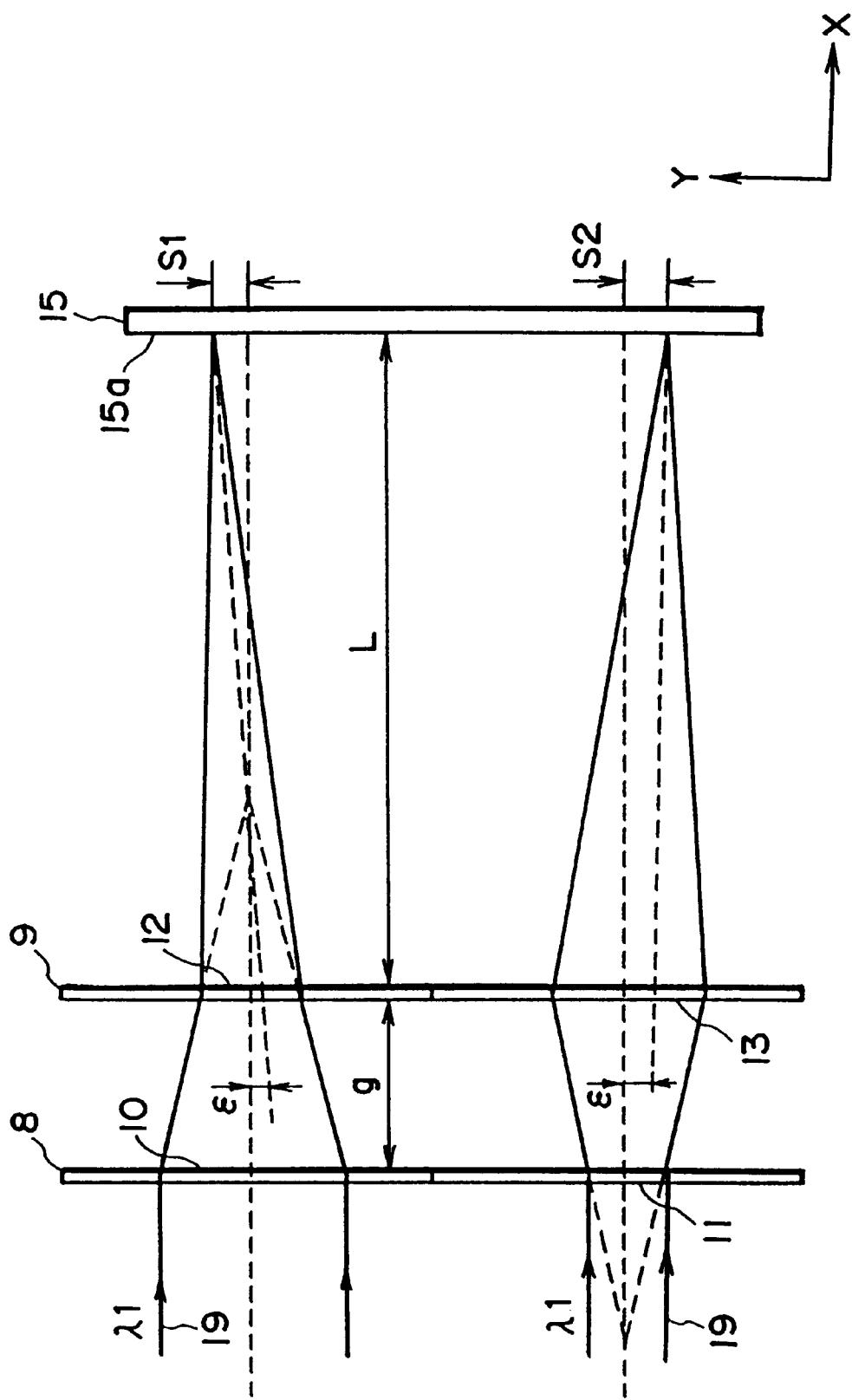
FIG. 3 is a schematic view for explaining a positional deviation detecting process in the present invention.

FIG. 1 is a schematic and perspective view of a main portion of a first embodiment of the present invention, and FIG. 2 is an enlarged view of a portion of FIG. 1. FIGS. 3 and 4 are schematic views, respectively, for explaining detection of relative position of first and second objects in accordance with the present invention.

In this embodiment, the invention is applied to an exposure apparatus of proximity type, for manufacture of semiconductor devices. Denoted in these drawings at 8 is a mask (first object) on which an electronic circuit pattern is formed. Denoted at 9 is a wafer (second object). Denoted at 10 and 11 are alignment marks formed on the surface of the mask 8, each mark comprising a physical optic element. Denoted at 12 and 13 are alignment marks formed on the surface of the wafer 9, each mark comprising a physical optic element.

In this embodiment, the physical optic elements 10–13 are used for the detection with respect to a direction along a plane parallel to them, that is, they are used as lateral deviation detecting alignment marks (AA marks).

Each of the physical optic elements in this embodiment may comprise a Fresnel zone plate or grating lens having a one-dimensional or two-dimensional lens function or, alternatively, it may comprise a diffraction grating having no lens function, for example.

In this embodiment, light of a wavelength $\lambda 1$ from a light source 1 such as a laser diode is transformed by a collimator lens 2 into a parallel light. The parallel light is directed by way of a light projecting lens 3 and a half mirror 4, and it is deflected by a mirror 5. The light is then transmitted through a filter, and it is projected on the physical optic element 10 (11) on the mask 8, placed within an exposure region 7. The light influenced by the physical optic element 10 (11) is then projected on the physical optic element 12 (13) on the wafer 9 surface.

Diffraction light from these physical optic elements contains information that represents the amount of lateral deviation between the mask 8 and the wafer 9, and, after passing the filter, the light is imaged on a light receiving surface of a photodetector 15 by means of a light receiving lens 14.

On the other hand, light of a wavelength $\lambda 2$ from a light source 16, different from the wavelength $\lambda 1$, is transformed by a collimator lens 17 into a parallel light. The parallel light is directed by way of a light projecting lens 18 and the half mirror 4, and it is deflected by the mirror 5. The light is then transmitted through the filter 6, and it is projected on the physical optic element 10 (11) of the mask 8, placed within the exposure region 7. The light optically influenced by the physical optic element 10 (11) is then projected on the physical optic element 12 (13).

Diffraction light from these physical optic elements contains information that represents the amount of lateral deviation between the mask 8 and the wafer 9, and, after passing the filter, the light is imaged on the light receiving surface of the photodetector 15 by means of the light receiving lens 14.

FIG. 2 illustrates the relation between projected light and disposition of physical optic elements on the mask 8 and the wafer 9, in the FIG. 1 embodiment. Illumination light 19 from the light source 1 or 16 is projected on the physical optic element 10 (11), whereby the light is diffracted. After this, the light is diffracted by the physical optic element 12 (13), whereby diffraction light 20 (21) is produced, which diffraction light is directed to the photodetector 15.

FIG. 3 is a schematic view for explaining the principle of relative alignment of the mask 8 and the wafer 9, based on the physical optic elements 10–13 shown in FIG. 2. In FIG. 3, on the mask 8 and the wafer 9, there are physical optic elements 10–13 each comprising a Fresnel zone plate having a lens function. Among them, the physical optic elements 10 and 11 are formed on the mask 8, and the physical optic elements 12 and 13 are formed on the wafer 9. The mask 8 and the wafer 9 are disposed with a spacing g therebetween.

The physical optic elements 10, 11, 12 and 13 have focal lengths f1, f2, f3 and f4, respectively. Light 19 of a wavelength $\lambda 1$ is projected, as parallel light, on to the two physical optic elements 10 and 11 upon the mask 10. The light having been influenced by the lens function of the physical optic element 10 (11) is then collected by the physical optic element 12 (13), disposed opposed to it, toward the light receiving surface 15a of the photodetector 15 which is disposed at a distance L from the wafer 9.

Here, if there occurs a deviation $\epsilon$ in Y direction between the mask 8 and the wafer 9, the two light spots as converged on the light receiving surface 15a of the photodetector 15 are responsive to a change in optical disposition between the physical optic elements on the mask and wafer, and the positions of these light spots shift by S1 and S2, as follows:

$$S1 = [1-\{L/(f1-g)\}] \times \epsilon$$

$$S2 = [1-\{L/(f3-g)\}] \times \epsilon$$

If f1=230 $\mu$m, f3=−230 $\mu$m, g=30 $\mu$m and L=20 mm, it follows that:

$$S1 = -99 \cdot \epsilon$$

$$S2 = 77.9 \cdot \epsilon$$

Thus, for a relative positional deviation $\epsilon$ between the mask 8 and the wafer 9, there occurs a change in interval of light spots on the light receiving surface 15a of the photodetector 15 which change is being magnified 176.9 times.

In this embodiment, by detecting the change in interval of the light spots, the relative positional deviation $\epsilon$ between the mask 8 and the wafer 9 can be detected precisely.

Generally, when physical optic elements formed on a mask and a wafer are used to perform relative alignment of the mask and the wafer, due to spectral transmissivity of the mask, process dependency of the wafer or film thickness of a resist, the light quantity of spot light as imaged on the light receiving surface of a photodetector varies. In that occasion, it may be difficult to obtain a sufficient signal light quantity or S/N ratio necessary for the alignment procedure, and to ensure relative alignment of the mask and the wafer.

In this embodiment, in consideration of it, lights of different wavelengths are projected on physical optic elements on these objects. In that case, the lights of different wavelengths may be projected in different states of convergence or divergence such that lights as converged or diverged by respective physical optic elements are converged upon the detection plane. This ensures production of a detection signal of sufficient intensity and satisfactory S/N ratio. Thus, it assures good stability of detection signal and, therefore, high precision position detection.

Next, description will be made of a case where the optical system arrangement of physical optic elements 10–13 is used to perform position detection, wherein light of a wavelength $\lambda 2$ from light source means 16 is projected to the physical optic elements 10 and 11 on the mask 8 and wherein light diffracted thereby and again diffracted by the physical optic element 12 (13) is converged on the light receiving surface of a photodetector 22.

Figure 4A:
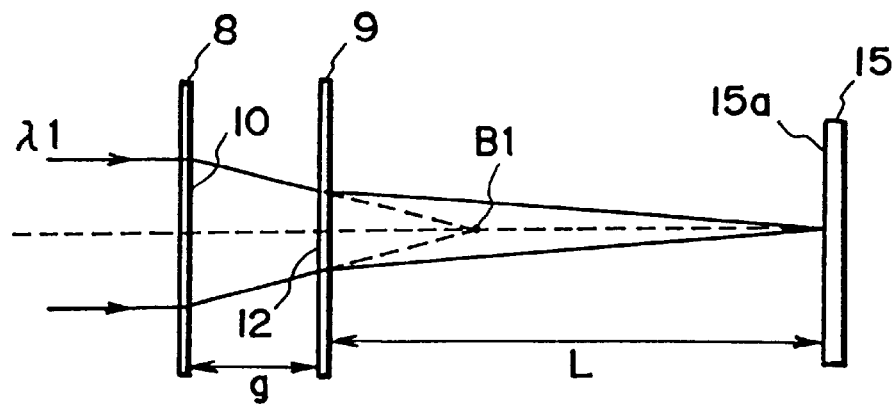
FIGS. 4A–4C are schematic views, respectively, each for explaining a positional deviation detecting process in the present invention.
Figure 4B:
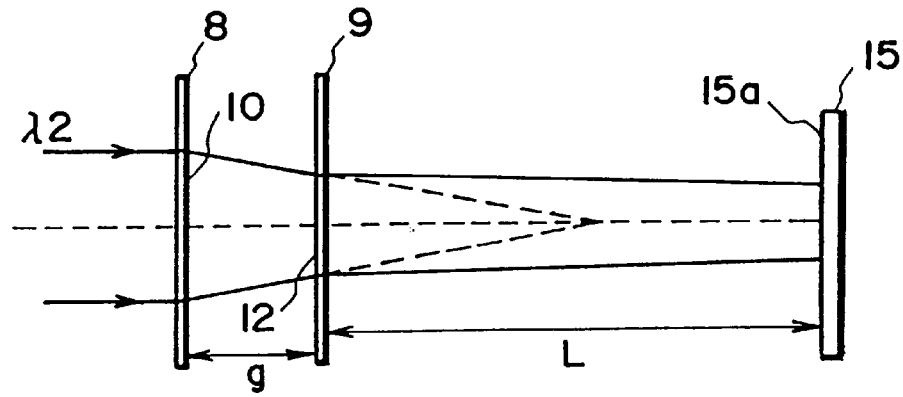
Figure 4C:
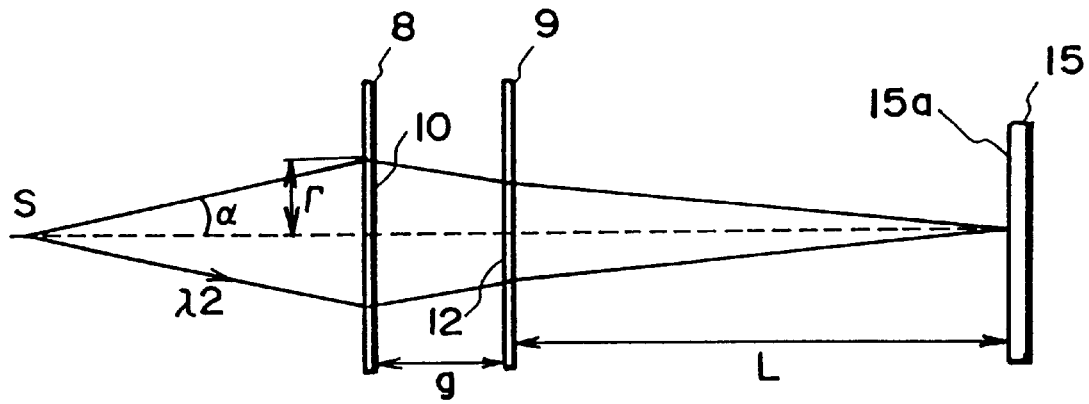

FIGS. 4A and 4B illustrate light paths when lights of wavelengths $\lambda 1$ and $\lambda 2$ are projected to the arrangement of physical optic elements described with reference to FIG. 3. As shown in FIG. 4A, when parallel light of wavelength $\lambda 1$ is projected on to the physical optic element 10, the resultant light goes through the physical optic element 12 and it is converged upon the light receiving surface 15a of the photodetector 15.

Here, the point of convergence of the parallel light defined by the physical optic element 10 is denoted by B1 and a concentric Fresnel zone plate is assumed as a typical example of physical optic element. If in this case the radius of ring of the Fresnel zone plate is rm (m is the number of that ring), the convergent point B1 is at a position spaced from the Fresnel zone plate by a focal length f1 of the Fresnel zone plate, and the following equation applies:

$$\sqrt{rm^2+f1^2}-f1=m\cdot\lambda1$$

Regarding f1, it follows from this that:

$$f1=\{rm^2-(m\cdot\lambda1)^2\}/(2m\cdot\lambda1)$$

If f1=230 μm and λ1=0.83 μm, then the radius rm of the ring is:

$$rm^2=(m\cdot\lambda1+f1)^2-f1^2$$

Thus, the radius of the first ring is:

$$r1^2=19.6 \ \mu m$$

With the combination of physical optic element 10 of the mask having such property as described above and physical optic element 12 of the wafer 9 having a characteristic of focal length f2 (the wafer being spaced by a distance g), the parallel light impinging on the physical optic element 10 is imaged upon the light receiving surface 15a of the photodetector 15.

On the other hand, when light of wavelength λ2 is projected on the physical optic element 10 in the state of parallel light as shown in FIG. 4B, the physical optic element 10 functions as a lens having a focal length f1', as represented by the following equation:

$$f1'=\{rm^2-(m\cdot\lambda2)^2\}/(2m\cdot\lambda2)$$

If f' is detected on an assumption that λ2=0.63 μm and m=1, it follows that:

$$f1'=304.6 \ \mu m$$

Here, if the spacing between the physical optic elements 10 and 12 is g, and the distance between the wafer 9 and the light receiving surface 15a of the photodetector 15 is L, the light coming via the physical optic elements 10 and 12 is not imaged upon the light receiving surface 15a of the photodetector 15.

It is seen therefrom that, with use of light of wavelength λ2, relative positioning of the mask and the wafer cannot be attained with good precision. Here, in place of parallel light for the light of wavelength λ2, light may be projected on to the physical optic element 10 in the state of divergent light with an angle α, from an object point which is at a distance s from the principal point of the physical optic element 10 such that, after passing the physical optic elements 10 and 12, it may be imaged on the light receiving surface 15a of the photodetector.

Here, in order that the light of wavelength λ2 is converged upon the light receiving surface of the photodetector, light of wavelength λ2 may be projected on the physical optic element 10 in the following state. That is, referring to FIG. 4C, the physical optic element 10 has a focal length f1' with respect to the wavelength λ2 while the physical optic element 12 has a focal length f2' with respect to the same wavelength λ2. The focal length f' of the imaging system which comprises these two physical optic elements, can be expressed as follows:

$$1/f'=(1/f1')-(1/f2')\times(1-g/f1')$$

For ensuring that light is converged at the position of image point distance L with use of an optical system having a focal length f', the object point distance s can be determined in accordance with the following equation:

$$1/L=(1/S)+(1/f')$$

Therefore, $$s=(L\cdot f)/(f'-L)$$

Thus, if the object point is set at a distance s from the physical optic element 10 and the physical optic element has an effective radius r, a relay lens may be disposed which lens is effective to converge the light of wavelength λ2, from the light source, toward the object point s with an angle θ as follows:

$$\theta=\tan^{-1}(r/s)$$

In that occasion, the light of wavelength λ2 can be converged by means of the physical optic elements 10 and 12, on the light receiving surface 15a of the photodetector 15.

In FIG. 1, the light of wavelength λ2 from the light source 16 is transformed by the collimator lens 17 into a parallel light which is then influenced by the light projecting lens 18, whereby light being convergent at a distance s from the physical optic element 10 with an angle θ is provided. The elements denoted at 1–4 and 16–18 are components of light projecting means.

In the schematic illustration of the first embodiment in FIG. 1, paths of lights of different wavelengths emitted by different light sources are combined into a single path, after the half mirror 4, and the lights are projected on the physical optic elements 10 and 11 upon the mask 8. However, the positions of the light sources 1 and 16 may be changed such that lights to be projected on to the physical optic elements 10 and 11 of the mask 8 do not advance along the same path after the half mirror 4.

Further, in this embodiment, only one set of physical optic elements are used to detect any positional deviation between the mask 8 and the wafer 9 and lights of difference wavelengths λ1 and λ2 are projected to them. However, plural physical optic elements each corresponding to different light sources used may be provided, and position detection may be performed with use of them.

While in this embodiment the combination of physical optic elements 10 and 12 has been described in detail, regarding the combination of physical optic elements 11 and 13, similarly lights of different wavelengths may be projected in different states of convergence or divergence by which a detection signal can be converged on the light receiving surface 15a of the photodetector 15.

In this embodiment as described hereinbefore, lights of different wavelengths from different light sources are used for relative alignment of a mask and a wafer, wherein for each light from each light source the state of convergence or divergence of light being projected to a physical optic element is optimized, to thereby ensure stable production of good detection signal light and attainment of high precision alignment.

Figure 5:
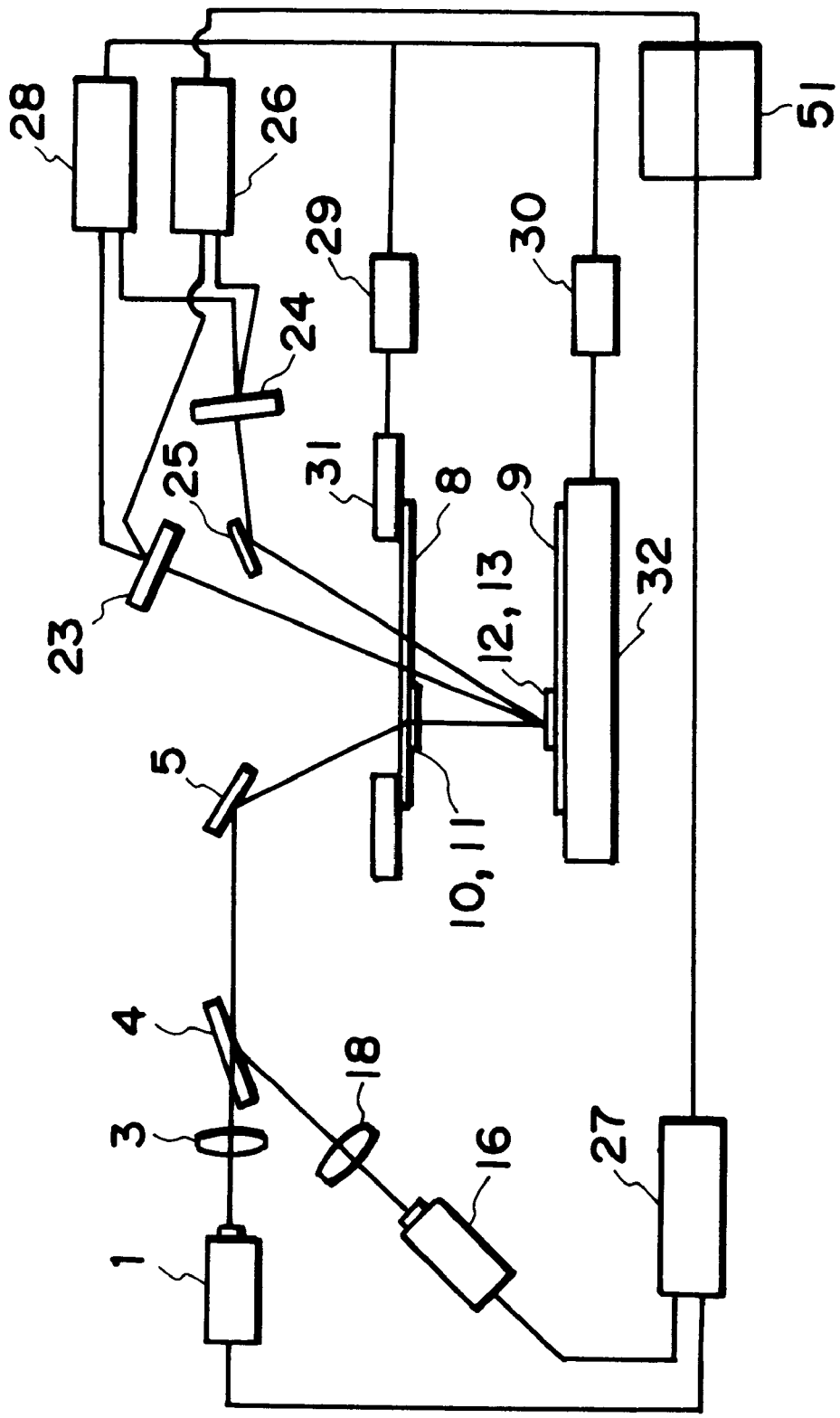
FIG. 5 is a schematic view of a main portion of a position detecting system according to a second embodiment of the present invention.

FIG. 5 is a schematic view of a second embodiment of the present invention. As described hereinbefore, when physical optic elements of a mask and a wafer are used to perform relative alignment of the mask and wafer, the light quantity of spot light as imaged on a light receiving surface of a photodetector may change due to spectral transmissivity of mask, process dependency of wafer or resist film thickness. In that occasion, it may be difficult to obtain sufficient signal light quantity or S/N ratio necessary for the alignment procedure, and it may be difficult to accomplish the mask-to-wafer relative alignment.

In this embodiment, before executing relative alignment of a mask and a wafer, different light sources are used and alignment signals are detected beforehand with use of a photodetector. Peak light quantity or S/N ratio of each produced signal light is measured, such that wavelength selecting means selects those light sources of wavelengths with which satisfactory signal light, sufficient for a signal for the relative alignment, is obtainable.

Figure 6:
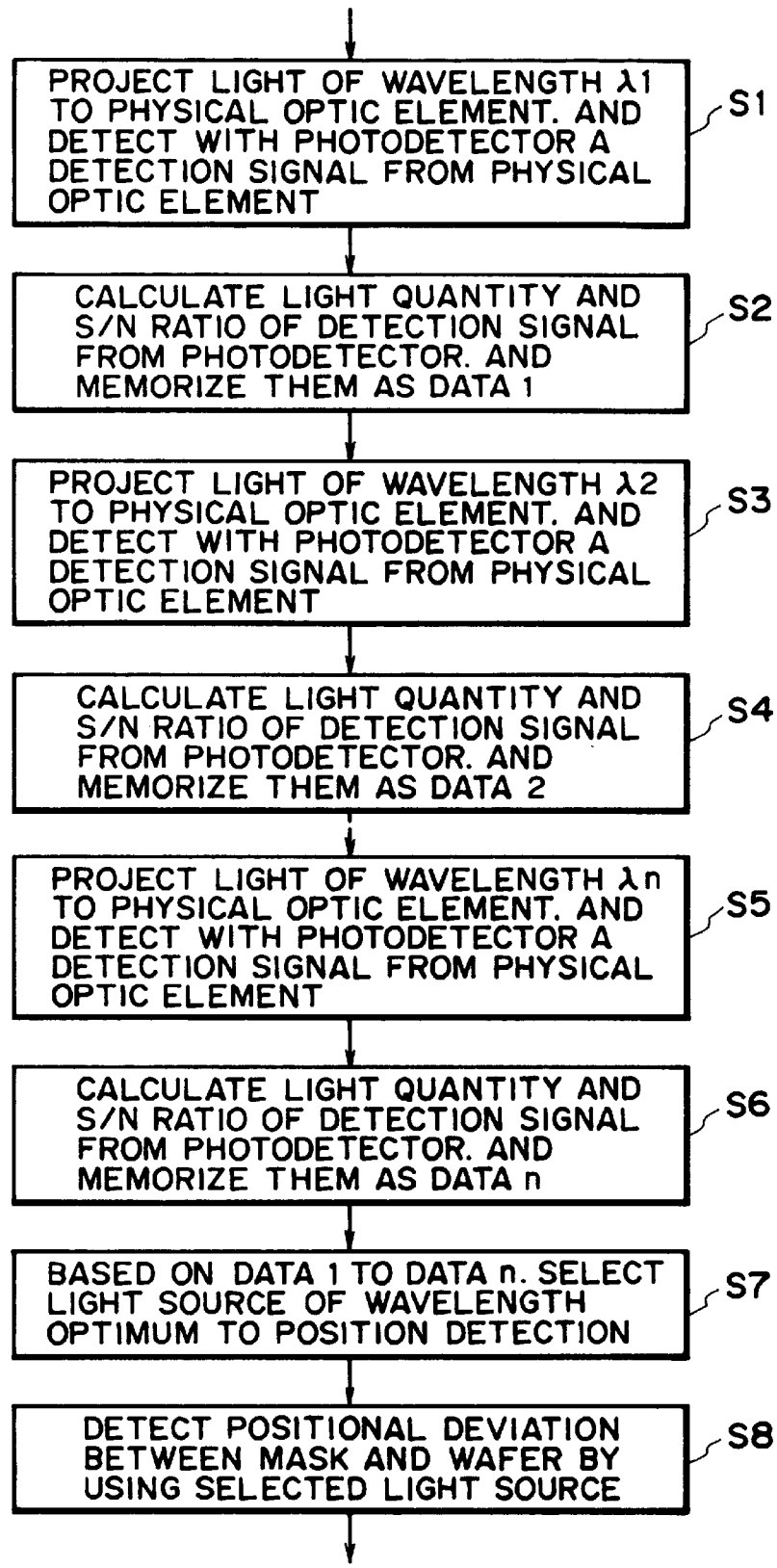
FIG. 6 is a flow chart for explaining the procedure in the second embodiment of the present invention.

FIG. 6 is a flow chart of optimum light source selection procedure (steps S1–S8) in this embodiment. Light emitted by a light source provided is projected on to physical optic elements of a mask and a wafer sequentially, and an alignment signal is produced. Peak light quantity or S/N ratio of that alignment signal is stored into a memory means. In this manner, alignment signal information related to lights of all the light sources provided is obtained. After this, wavelength selecting means selects a light source of a wavelength best suited to the measurement.

As an alternative, plural photodetectors may be used in association with different light sources of different wavelengths, respectively, and these light source may be turned on simultaneously. Alignment signals obtainable with different lights may be detected by respective photodetectors corresponding to the light sources, respectively, and an optimum light source may be selected on the basis of the information obtained with the alignment signals.

The structure of this embodiment will be explained with reference to FIG. 5. In FIG. 5, lights from light sources 1 and 16 having different wavelengths, are directed by way of respective imaging optical systems (3, 18, 4, 5), physical optic elements 10–13 of mask 8 and wafer 9, and a mirror 25, and they are imaged upon light receiving surfaces of photodetectors 23 and 24, respectively.

Here, the photodetector 23 serves as a photodetector for receiving light of wavelength $\lambda 1$, and the photodetector 24 serves as a photodetector for receiving light of wavelength $\lambda 2$. Spatial separation of plural lights is provided by the mirror 25. If optical axes of plural lights directed to the photodetectors are close to each other and spatial separation by a mirror is difficult to attain, a filter (not shown) having a wavelength selecting function may be used to provide separation.

Alignment signals as measured by the photodetectors 23 and 24 are stored into a memory 26. On the basis of the data (light quantity and/or S/N ratio, for example) stored in the memory 26, wavelength selecting means 51 selects optimum wavelength selection. Corresponding information regarding the light source to be used is applied to a laser driver 27.

By using light from the thus selected light source, measurement of relative positional deviation between the mask 8 and the wafer 9 is performed. Alignment signals from the photodetectors 23 and 24 in that occasion are processed by an operation circuit 28, and the amount of movement of a mask holder 31 and/or a wafer stage 23 is determined in accordance with the amount of relative positional deviation. Corresponding drive signals are then applied to actuators 29 and 30.

In the first embodiment shown in FIG. 1, a single photodetector 15 is used in relation to plural light sources 1 and 16. When as compared therewith photodetectors such as at 23 and 24 are provided in relation to lights of different wavelengths, respectively, as shown in FIG. 5, the process of selecting optimum wavelength beforehand can be omitted. For measurement of relative positional deviation of a mask and a wafer, all the plural light sources may be turned on for each measurement of relative positional deviation, and relative alignment of mask and wafer may be performed while selecting only a signal of a wavelength with which satisfactory signal for measurement is obtainable.

A modified form of this embodiment will be explained with reference to FIG. 5. In this example, in the detection optical system for detecting relative positional deviation between the mask 8 and the wafer 9, lights of different wavelengths from light sources 1 and 16 are projected on to physical optic elements 10 and 11 of the mask 8 by way of light projecting lenses 3 and 18, a half mirror 4 and a mirror 5.

Divergent or convergent light from the physical optic element 10 (11) is projected on the physical optic element 12 (13) of the wafer 9. Of the light diffracted by the physical optic element 12 (13), diffraction light of wavelength $\lambda 1$ is directed to the photodetector 23, while diffraction light of wavelength $\lambda 2$ is directed to the photodetector 24 after being deflected by the mirror 25. Output signals from the photodetectors 23 and 24 are applied to an operation circuit 28 in which, for each output signal of the photodetector, the amount of relative positional deviation between the mask 8 and the wafer 9 is calculated. On the basis of plural relative positional deviations thus calculated, an average of them is calculated.

From the average relative positional deviation thus obtained, the amount of movement of the mask holder 31 and/or the wafer stage 32 is determined, and corresponding drive signal is applied to the actuator 29 and/or actuator 30.

Figure 7:
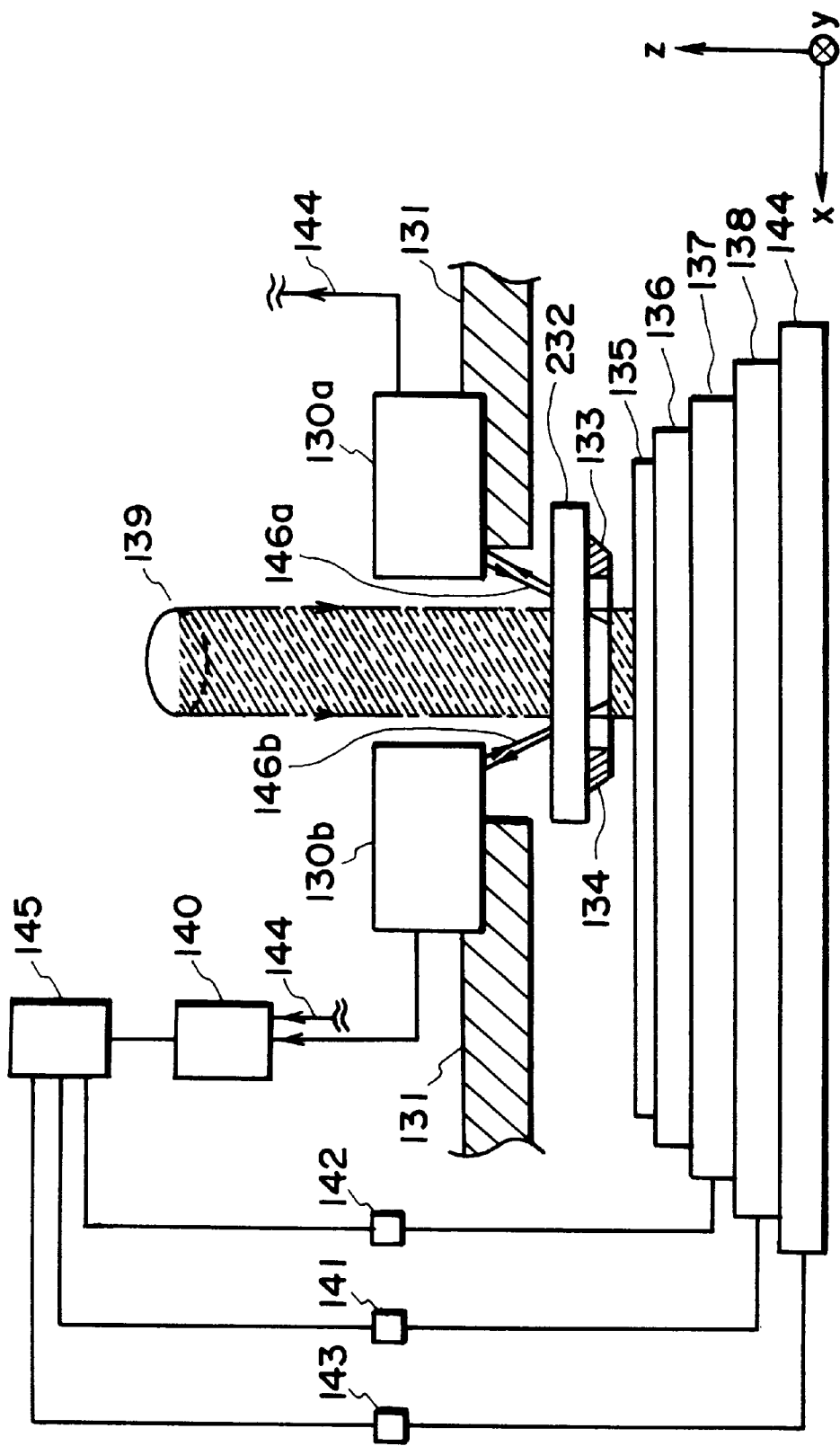
FIG. 7 is a schematic view of a main portion of a position detecting system according to a third embodiment of the present invention.

FIG. 7 is a schematic view of a main portion of a third embodiment wherein a position detecting system of the invention is applied to a semiconductor device manufacturing exposure apparatus using X-rays. In FIG. 7, denoted at 139 is an X-ray beam which illuminates the surface of a mask 134. Denoted at 135 is a wafer whose surface is coated with an X-ray resist, for example. Denoted at 133 is a mask frame, and denoted at 134 is a mask membrane (mask) on which an IC pattern is formed with an X-ray absorbent material. Denoted at 232 is a mask support, and denoted at 136 is a wafer fixing member such as a wafer chuck, for example. Denoted at 137 is a Z-axis stage which is, in practice, made tiltable. Denoted at 138 is an X-axis stage, and denoted at 144 is a Y-axis stage.

The mask-to-wafer positional deviation detecting function (positional deviation detecting system) having been described with reference to the preceding embodiments, is accommodated in housings 130a and 130b which are supported by a supporting plate 131. Gap information and lateral positional deviation information along X-Y plane, of the mask 134 and the wafer 135, are produced by this functioning portion.

While in FIG. 7 two positional deviation detecting functioning portions 130a and 130b are illustrated, there are two additional positional deviation detecting functioning portions, so that all four meet four sides of IC pattern area on the mask 134, respectively. The housings 130a and 130b each accommodates an optical system and a detection system. Denoted at 146a and 146b are lights for positional deviation detection, respectively.

Signals obtained with these positional deviation detecting functioning portions are processed by processing means 140, and a deviation along X-Y plane and a gap are determined. After discrimination of obtained results, if the deviation is out of a predetermined range, control means 145 operates to actuate driving systems 141, 142 and 143 for respective axis-stages, to reduce the deviation into a predetermined tolerance. Also, a driving system for the mask support is actuated to move the mask 134 or, alternatively, the wafer 135 is displaced, by an amount necessary for correcting an alignment error resulting from exposure distortion. After that, X-ray beam 139 is projected on to the mask 134. Before the alignment procedure is completed, X-ray shutter member (not shown) is used to block the X-ray beam. In FIG. 7, X-ray source and X-ray illumination system are not shown.

While an X-ray exposure apparatus of proximity type has been described with reference to FIG. 7, the same applies to an optical stepper. Further, the present invention is similarly applicable also to a sequential motion type reduction projection exposure apparatus wherein a light source of i-line ($\lambda$=365 nm), KrF excimer light ($\lambda$=248 nm) or ArF excimer light ($\lambda$=193 nm), for example, is used to provide illumination light, or to a mirror projection type exposure apparatus of unit magnification.

Figure 8:
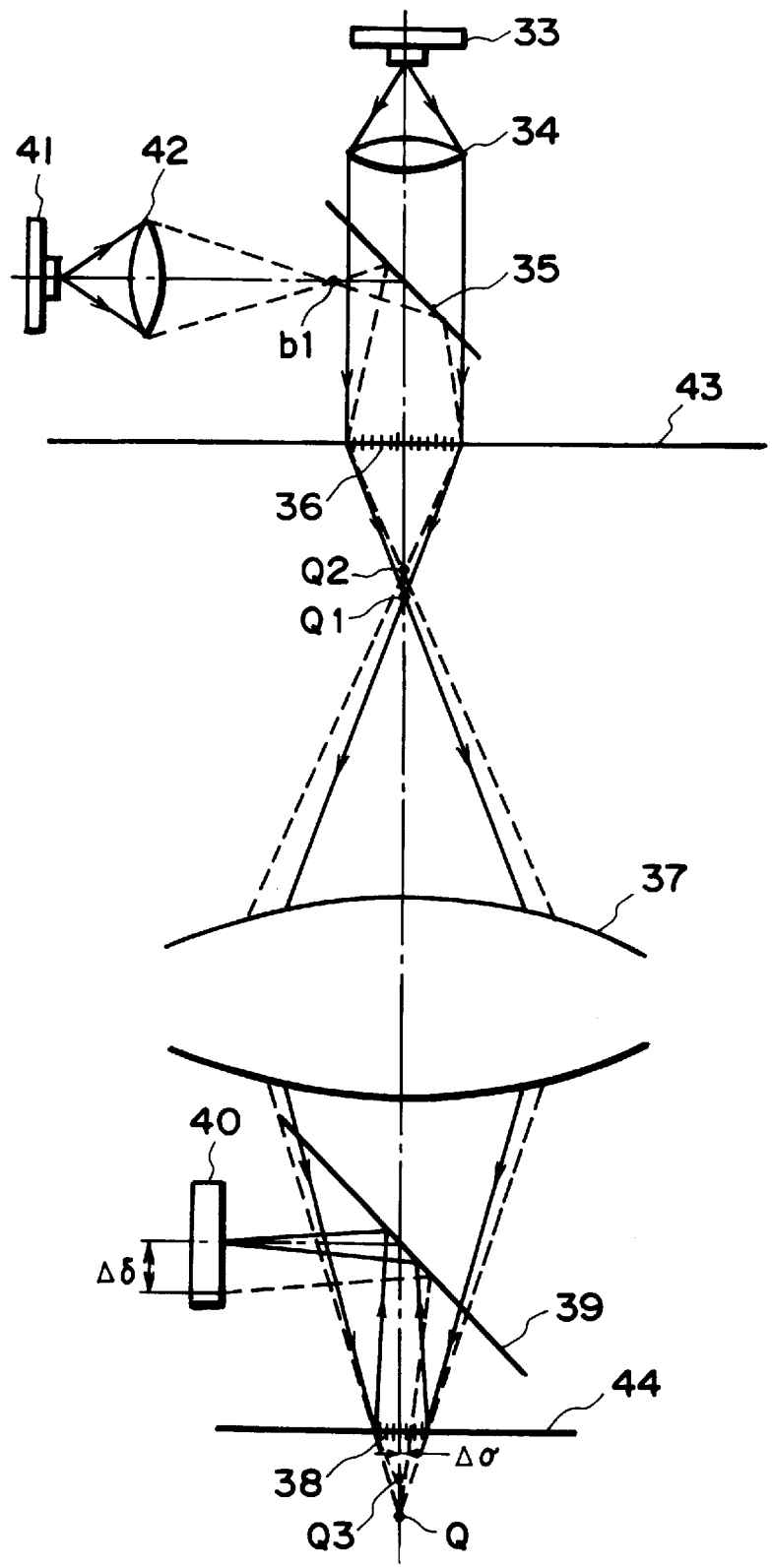
FIG. 8 is a schematic view of a main portion of a position detecting system according to a fourth embodiment of the present invention.

FIG. 8 is a schematic view of a fourth embodiment of the present invention. In this embodiment, the invention is applied to a sequential motion type reduction projection exposure apparatus. In FIG. 8, light of a wavelength $\lambda 1$ from a light source 33 is projected, as parallel light, on to a reticle alignment pattern 36 on a reticle 43, by means of a light projecting lens 34. Here, the reticle alignment pattern 36 is provided by a transmission type physical optic element having a lens function for converging the transmitted light toward a point Q1.

Light from the point Q1 is collected by a reduction lens system 37 on to a point Q. On a wafer 44, there is a wafer alignment pattern 38 which is provided by a reflection type physical optic element. It serves to reflect the light convergent on the point Q and, by way of a half mirror 39, to converge it toward the detection surface of a photodetector 40.

On the other hand, light of a wavelength $\lambda 2$ from a light source 41 is converged at point b1 by means of a light projecting lens 42, and divergent light from the point b1 illuminates the reticle alignment pattern 36 of the reticle 43. Here, due to the lens function of the reticle alignment pattern 36, the light of wavelength $\lambda 2$ is converged at point Q2.

Light from the point Q2 is collected by a condensing lens system 37 at point Q3, whereby the wafer alignment pattern 38 is illuminated. The light projected on the wafer alignment pattern 38 is then converged upon the detection surface of the detector 40, by way of the half mirror 39. Here, selection of one of plural light sources provided, for measurement of relative positional deviation between the reticle 43 and the wafer 44, is performed in a similar manner as has been described hereinbefore. From deviation $\Delta\epsilon$ of light collected on the detection surface of the photodetector 40, relative positional deviation $\Delta\sigma$ between the reticle 43 and the wafer 44 is detected.

Next, an embodiment of device manufacturing method which uses an exposure apparatus such as described hereinbefore, will be explained.

Figure 9:
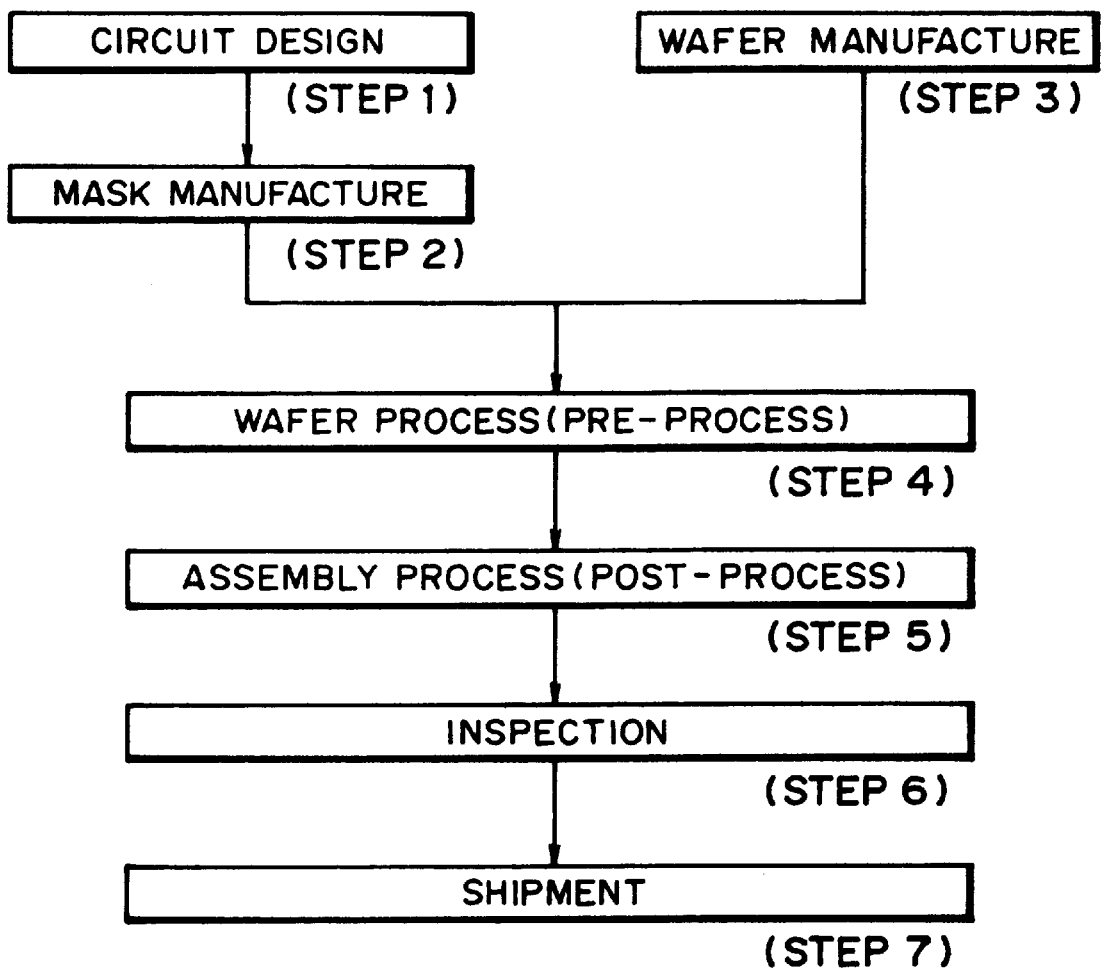
FIG. 9 is a flow chart for explaining device manufacturing processes in an embodiment of the present invention.

FIG. 9 is a flow chart of procedure for manufacture of microdevices such as semiconductor chips (e.g. ICs or LSIs), or liquid crystal panels, CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 10:
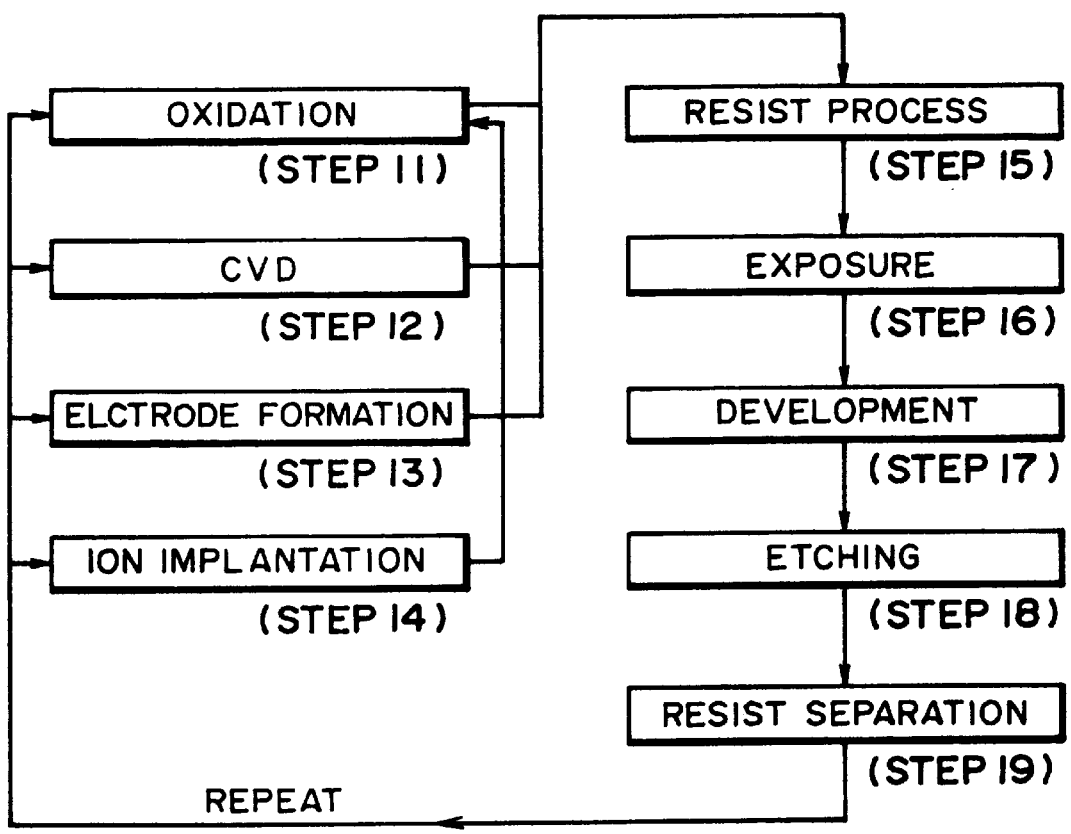
FIG. 10 is a flow chart for explaining a wafer process in the procedure of FIG. 9.

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments described above, use may be made of a light source which provides light of an optimum wavelength in association with material of a mask membrane, process dependency of a wafer or film thickness of a resist, for irradiation of an alignment mark with light. This ensures high precision detection of relative positional deviation between first and second objects even when the state of them changes. Therefore, a position detecting system capable of performing high precision alignment as well as a device manufacturing method based on it, are provided.

Particularly, the invention assures a position detecting system and a device manufacturing method based on it, which are not affected or less affected by variation in spectral transmissivity due to a mask material used, or variation in alignment signal light due to a difference in wafer process dependency or in resist film thickness.

While the invention has been described with reference to the structures disclosed herein, it is not confined to the details set forth and this application is intended to cover such modifications or changes as may come within the purposes of the improvements or the scope of the following claims.

What is claimed is:

1. A detection system for detecting relative position of a first object and a second object having first and second physical optic elements, respectively, said system comprising:

a light projecting system for projecting light to one of the first and second physical optic elements, wherein light from one of the first and second physical optic elements illuminated with the light from said light projecting system is projected to another of the first and second physical optic elements; and a light receiving system for receiving light from the other of the first and second physical optic elements illuminated with the light from the one of the first and second physical optic elements, wherein a relative position of the first and second objects can be detected by detecting positional information related to a position of the thus received light upon a predetermined plane, wherein said light projecting system projects lights of different wavelengths through an optical arrangement at least a portion of which is provided by separate optical elements, such that the lights of different wavelengths pass through the separate optical elements and are projected onto the one of the first and second physical optical elements in different states of convergence or divergence, and wherein said light receiving system directs the lights of different wavelengths to the predetermined plane and focuses both of the lights of different wavelengths thereon through a common optical system.

2. A detecting system according to claim 1, wherein said light projecting system includes plural light sources for providing lights of different wavelengths, respectively, and wherein said light projecting system serves to project the lights from said plural light sources to the one of the first and second physical optic elements in different states of convergence or divergence, simultaneously or sequentially.

3. A detection system according to claim 1, wherein at least one of the first and second physical optic elements has a lens function.

4. A detecting system according to claim 1, further comprising means for selecting one of the lights of different wavelengths, for illumination of the one of the first and second physical optic elements.

5. A detecting method for detecting relative position of a first object and a second object having first and second physical optic elements, respectively, said method comprising the steps of:

projecting lights of different wavelengths through an optical arrangement at least a portion of which is provided by separate optical elements, such that the lights of different wavelengths pass through the separate optical elements and are projected onto one of the first and second physical optic elements in different states of convergence or divergence, respectively, wherein light from one of the first and second physical optic elements illuminated is projected to another of the first and second physical optic elements; and receiving light from the other of the first and second physical optic elements illuminated with the light from the one of the first and second physical optic elements, wherein, in said light receiving step, the lights of different wavelengths are directed to a predetermined plane through a common optical system, wherein a relative position of the first and second objects can be detected by detecting positional information related to a position of the thus received light upon the predetermined plane.

6. A method according to claim 5, wherein said light projection is performed by use of plural light sources for providing lights of different wavelengths, respectively, and wherein the lights from the plural light sources are projected to the one of the first and second physical optic elements in different states of convergence or divergence, simultaneously or sequentially.

7. A method according to claim 5, wherein at least one of the first and second physical optic elements has a lens function.

8. A method according to claim 5, further comprising detecting the plural lights of different wavelengths as received by the light receiving system, and selecting one of the lights of different wavelengths, for illumination of the one of the first and second physical optic elements.

9. A device manufacturing method, comprising the steps of:

detecting relative position of a mask and a wafer with a position detecting system which includes (i) a light projecting system for projecting light to one of first and second physical optic elements formed on the mask and the wafer, respectively, wherein light from one of the first and second physical optic elements illuminated with the light from said light projecting system is projected to another of the first and second physical optic elements, and (ii) a light receiving system for receiving light from the other of the first and second physical optic elements illuminated with the light from the one of the first and second physical optic elements, wherein a relative position of the mask and the wafer can be detected by detecting positional information related to a position of the thus received light upon a predetermined plane, wherein the light projecting system projects lights of different wavelengths through an optical arrangement at least a portion of which is provided by separate optical elements, such that the lights of different wavelengths pass through the separate optical elements and are projected onto the one of the first and second physical optic elements in different states of convergence or divergence, and the light receiving system directs the lights of different wavelengths to the predetermined plane and focuses both of the lights of different wavelengths thereon through a common optical system;

aligning the mask and the wafer whose relative position is detected by use of the position detecting system; and transferring a pattern of the mask to the wafer placed in alignment with the mask.

10. A device manufacturing method, comprising the steps of:

projecting lights of different wavelengths through an optical arrangement at least a portion of which is provided by separate optical elements, such that the lights of different wavelengths pass through the separate optical elements and are projected onto one of first and second physical optic elements, formed on a mask and a wafer, respectively, in different states of convergence or divergence, respectively, wherein light from the one of the first and second physical optic elements illuminated is projected to another of the first and second physical optic elements;

receiving light from the other physical optic element illuminated with the light from the one of the first and second physical optic elements, wherein, in said light receiving step, the lights of different wavelengths are directed to the predetermined plane and focuses both of the lights of different wavelengths thereon through a common optical system, and a relative position of the mask and the wafer can be detected by detecting positional information related to a position of the thus received light upon a predetermined plane;

aligning the mask and the wafer whose relative position is detected; and transferring a pattern of the mask to the wafer placed in alignment with the mask.

* * * * *

UNITED STATES PATENT AND TRADEMARK OFFICE
CERTIFICATE OF CORRECTION

PATENT NO. : 6,154,281
DATED : November 28, 2000
INVENTOR(S) : Koichi Sentoku, et al.

It is certified that error appears in the above-identified patent and that said Letters Patent is hereby corrected as shown below:

Title page,
The following should be inserted:
-- [30] Foreign Application Priority Data
June 28, 1996 [JP] Japan, 8-188632 --.

Item [57], Abstract,
Line 15, "on to" should read -- onto --.

Drawings,
Figure 6, in steps "S1", "S3" and "S5", "ELEMENT." should read -- ELEMENT, --.
Figure 6, in steps "S2", "S4" and S6", "PHOTODETECTOR." should read -- PHOTODETECTOR, --.
Figure 6, in step "S7" "DATA n." should read -- DATA n, --
Figure 10, in "(STEP 13)", "ELCTRODE" should read -- ELECTRODE --.

Column 3,
Line 67, "on to" should read -- onto --.

Column 4,
Line 61, "on to" should read -- onto --.

Column 5,
Line 49, "on to" should read -- onto --.

Column 6,
Line 35, "on to" should read -- onto --.
Line 40, "difference" should read -- different --.

Column 7,
Line 14, "on to" should read -- onto --.
Line 24, "source" should read -- sources --.

Column 8,
Line 10, "on to" should read -- onto --.

Column 9,
Line 5, "on to" should read -- onto --.
Line 23, "on to" should read -- onto --.
Line 30, "on to" should read -- onto --.
Line 57, "procedure" should read -- procedures --.

UNITED STATES PATENT AND TRADEMARK OFFICE
CERTIFICATE OF CORRECTION

PATENT NO.    : 6,154,281
DATED         : November 28, 2000
INVENTOR(S)   : Koichi Sentokou, et al.

It is certified that error appears in the above-identified patent and that said Letters Patent is hereby corrected as shown below:

<u>Column 12,</u>
Line 54, "focuses" should be deleted.
Line 55, "thereon" should read -- are focused thereon --.

Signed and Sealed this

Second Day of October, 2001

Attest:

*Nicholas P. Godici*

NICHOLAS P. GODICI
*Attesting Officer*    *Acting Director of the United States Patent and Trademark Office*